(12) United States Patent
Yu

(10) Patent No.: US 6,319,798 B1
(45) Date of Patent: Nov. 20, 2001

(54) METHOD FOR REDUCING LATERAL DOPANT GRADIENT IN SOURCE/DRAIN EXTENSION OF MOSFET

(75) Inventor: Bin Yu, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/405,266

(22) Filed: Sep. 23, 1999

(51) Int. Cl.[7] .................................................. H01L 21/425
(52) U.S. Cl. ............................................. 438/527; 438/302
(58) Field of Search ...................................... 438/372–375, 438/376, 527–528, 529, 289, 290, 291, 302–305

(56) References Cited

U.S. PATENT DOCUMENTS

| | | | |
|---|---|---|---|
| 5,970,353 | * 10/1999 | Sultan et al. | 438/302 |
| 6,008,099 | * 12/1999 | Sultan et al. | 438/305 |
| 6,180,464 | * 1/2001 | Krivokapic et al. | 438/289 |
| 6,218,250 | * 4/2001 | Hause et al. | 438/302 |

* cited by examiner

Primary Examiner—David Nelms
Assistant Examiner—Dung A Le
(74) Attorney, Agent, or Firm—LaRiviere, Grubman & Payne, LLP

(57) ABSTRACT

A method for reducing lateral dopant gradient diffusion in the source/drain extension (SDE) region of a MOSFET includes forming the deep source and drain using high temperature dopant activation annealing, and then implanting a preamorphization species in an amorphized extension region that is to become the SDE region. Then, both SDE dopant and, if desired, halo dopant are implanted into the amorphized extension region and activated using relatively low temperature annealing, thereby reducing the thermal budget of the process and concomitantly reducing unwanted dopant thermal diffusion.

15 Claims, 3 Drawing Sheets

METHOD FOR REDUCING LATERAL DOPANT GRADIENT IN SOURCE/DRAIN EXTENSION OF MOSFET

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region in the substrate beneath the gate by implanting appropriate dopant materials into the areas of the substrate that are to become the source and drain regions. The gate is insulated from the substrate by a thin gate oxide layer, with small portions of the source and drain regions, referred to as "extensions", extending toward and virtually under the gate.

Between the source and drain regions and under the gate oxide layer is a source/drain extension (SDE) region, which is doped. The SDE region typically is doped early in the fabrication process, with the SDE dopant usually being implanted during the steps of forming the gate and source and drain regions. This generally-described structure cooperates to function as a transistor.

To suppress deleterious "short channel" effects such as threshold voltage roll-off (i.e., transistor operation at below intended voltages), it is important that the lateral dopant profile of the source/drain extensions be steep. Stated differently, it is important that virtually all of the dopant be concentrated within a relatively small area that is to function as the source/drain extension, with little or no dopant being located outside this relatively small doped region.

The present invention recognizes that the dopant gradient is deleteriously affected by high thermal budgets and particularly by high temperatures, such as those typically required during annealing to activate the dopant. Stated differently, exposing dopant in a source/drain extension to high temperatures can cause the dopant to thermally diffuse and, hence, can cause the dopant profile undesirably to spread. Nonetheless, the dopant must be activated for the device to function properly. The present invention has considered the above problem and has provided the solutions disclosed herein.

BRIEF SUMMARY OF THE INVENTION

A method for establishing at least one transistor on a semiconductor device includes providing a semiconductor substrate, and implanting deep dopants into the substrate to establish a source region and a drain region. Then, the method includes heating the substrate to activate the deep dopants. After activation, a neutral ion species is implanted in the substrate between the source and drain regions to define an amorphous extension region. Also, a source/drain extension (SDE) dopant is implanted in the amorphous extension region and is activated by heating the amorphous extension region.

In a preferred embodiment, the substrate is heated to more than nine hundred fifty degrees Celsius (950° C.) to activate the deep dopants, and the amorphous extension region is heated to no more than nine hundred fifty degrees Celsius (950° C.), and more preferably is heated to no more than six hundred fifty degrees Celsius (650° C.). With this process, the SDE dopant is substantially not thermally diffused.

As disclosed in greater detail below, the substrate defines a surface, and the neutral ion species preferably is implanted in the substrate by directing a beam of the neutral ion species onto the surface at an oblique angle to the surface. If desired, a halo dopant can also be implanted in the amorphous extension region. The amorphous extension region defines a depth, and the halo dopant is implanted to a halo depth of about one-half the depth of the amorphous extension region, with the SDE dopant in turn being implanted to a depth of about one-half the halo depth.

In another aspect, a method for making an ultra-large scale integration (ULSI) semiconductor device includes forming source and drain regions in a semiconductor substrate using a first activation temperature, then forming a doped source/drain extension (SDE) region between the source and drain regions using a second activation temperature less than the first activation temperature.

In yet another aspect, a semiconductor device includes a semiconductor substrate, at least one transistor gate on the substrate, and source and drain regions in the substrate below the gate. A source/drain extension (SDE) region is located between the source region and the drain region under the gate, and a recrystallized preamorphization substance is in the SDE extension region.

Other features of the present invention are disclosed or apparent in the section entitled "DETAILED DESCRIPTION OF THE INVENTION".

DETAILED DESCRIPTION OF THE INVENTION

Figure 1:
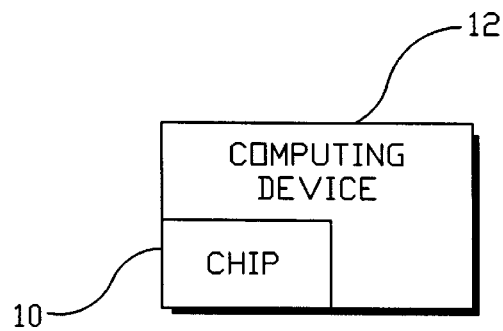
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
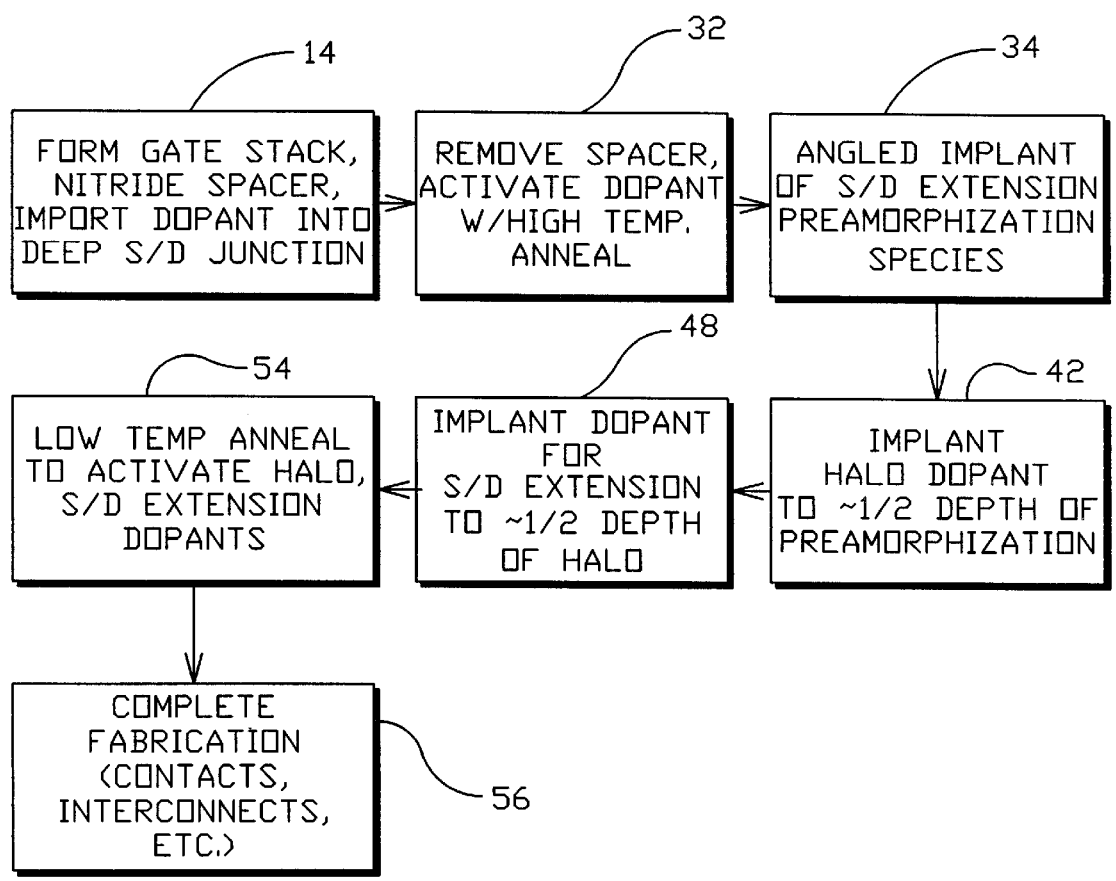
FIG. 2 is a flow chart showing the steps of the present invention.
Figure 3:
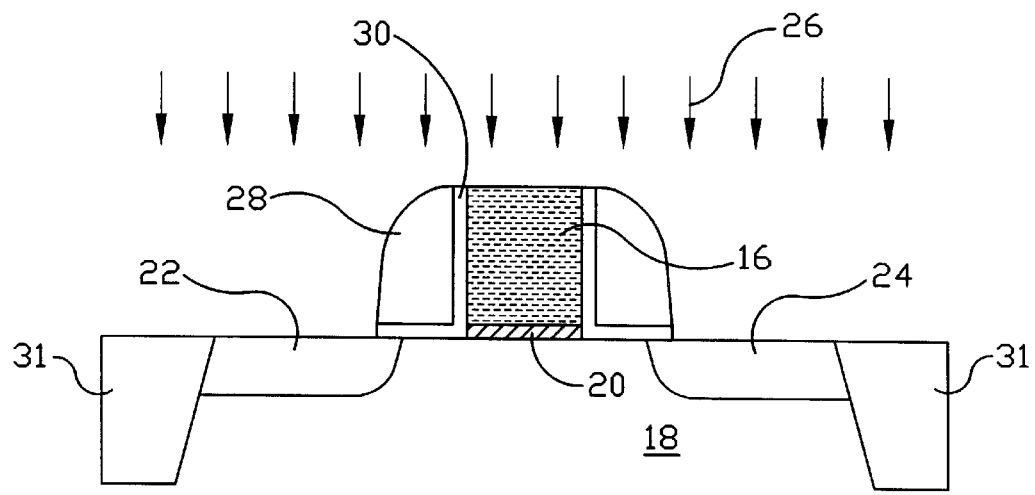
FIG. 3 is a side view of the device during deep source/drain junction dopant implant.

Now referring to FIGS. 2 and 3, as indicated at block 14 in FIG. 2 and as shown in FIG. 3, a transistor gate stack 16 is formed on a semiconductor substrate 18, with a gate oxide layer 20 being sandwiched therebetween. Regions that are to become source and drain regions 22, 24 are implanted with appropriate dopant, indicated by arrows 26. Also, the dopant is implanted into the gate stack 16, as indicated in FIG. 3. Prior to implanting the dopant, a silicon nitride or other dielectric spacer 28 is formed on the side walls of the gate stack 16 as shown, to shield the region directly under the gate stack 16 from the source and drain dopants. A thin oxide layer 30 is disposed between the spacer 28 and the gate stack 16, and isolation trenches 31 can be established on either side of the above-described MOSFET structure to isolate it from other MOSFETs.

Figure 4:
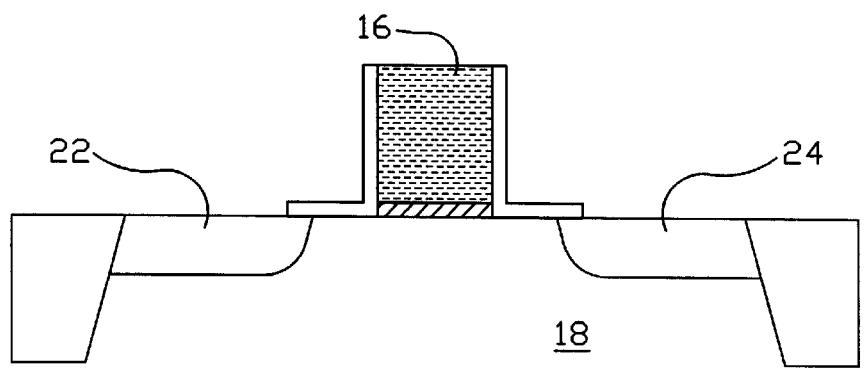
FIG. 4 is a side view of the device after deep source/drain junction dopant implant.

Proceeding to block 32 in FIG. 2 and now referring to FIG. 4, the spacer 28 is removed by, e.g., hot $H_3PO_4$ acid etch, and then the dopant in the source and drain regions 22, 24 is activated using high temperature annealing. The annealing is undertaken at a temperature of at least nine hundred fifty degrees Celsius (950° C.) and more preferably at a temperature in excess of 1000° C. In one preferred embodiment, the depth of the source and drain regions can be between eight hundred Angstroms to twelve hundred Angstroms.

Figure 5:
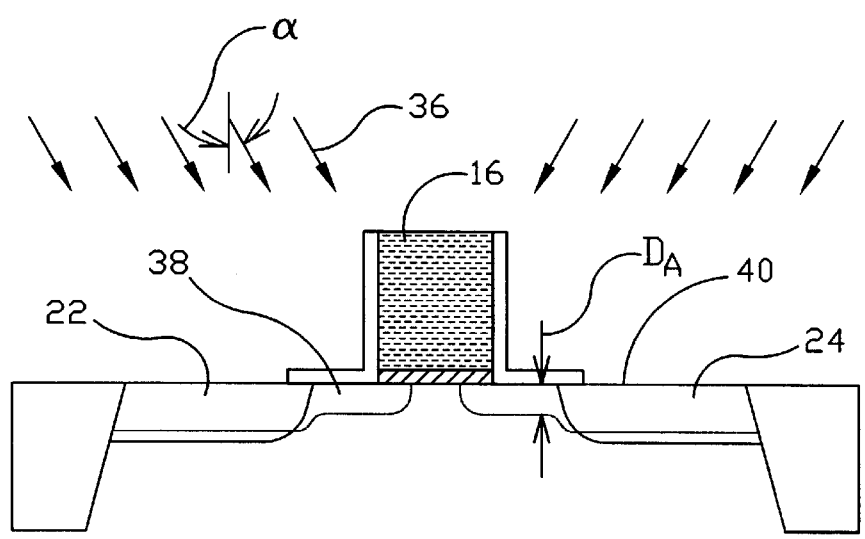
FIG. 5 is a side view of the device during preamorphization substance implanting.

Moving to block 34 and now referring to FIG. 5, a preamorphization substance such as a neutral ion species, e.g., ionic Silicon or Germanium, is implanted into the substrate 18 as indicated by the arrows 36 between the source and drain regions 22, 24 to define an amorphous extension region 38 that extends laterally under the gate stack 16 on both sides of the stack. The amorphous extension region 38 defines a depth $D_A$ from the surface 40 of the substrate 18 of about sixty nanometers to eighty nanometers (60 nm–80 nm).

In the preferred embodiment, the preamorphization substance is directed onto the substrate 18 at an oblique angle relative to the substrate surface 40. More particularly, the preamorphization substance is directed onto the substrate 18 at an angle α relative to the normal to the surface 40 of between twenty degrees and forty degrees (20°–40°) to control the distance by which the amorphization extension region 38 extends under the gate stack 16.

Figure 6:
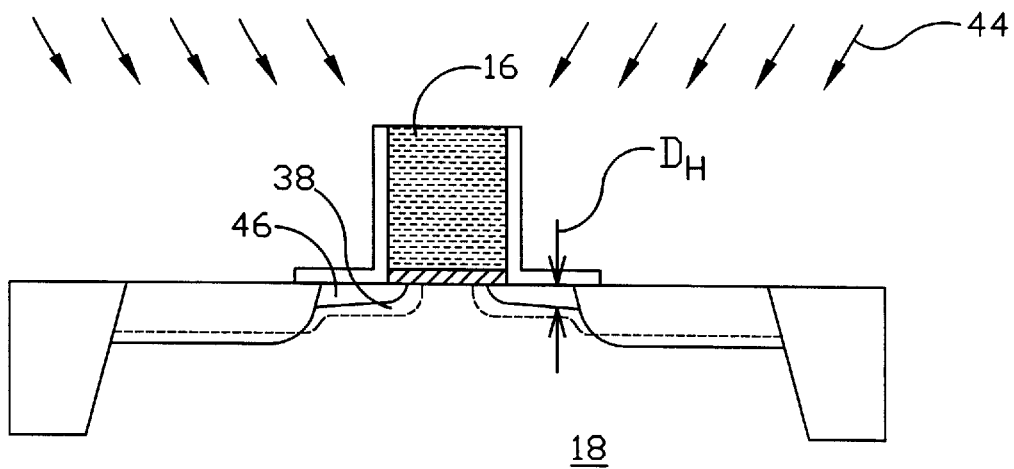
FIG. 6 is a side view of the device during halo dopant implanting.

Proceeding to block 42 and now referring to FIG. 6, a halo dopant, represented by arrows 44, is implanted into the substrate 18 partially under the gate stack 16 to establish a halo extension region 46. The halo dopant can be established by Phosphorous, Arsenic, or Antimony for n-channel MOSFETs or Boron or Boron Fluoride ($BF_2$) for p-channel MOSFETs, and can be implanted at a peak concentration of, e.g., between $1\times10^{19}$ atoms/cc and $1\times10^{19}$ atoms/cc. Also, the halo dopant is implanted down to a halo depth of $D_H$ from the surface 40 of the substrate, with the preferred halo depth $D_H$ being about one-half the depth $D_A$ of the amorphous extension region 38. If desired, the halo dopant can also be implanted at an oblique angle into the substrate 18, as indicated by the arrows 44.

Figure 7:
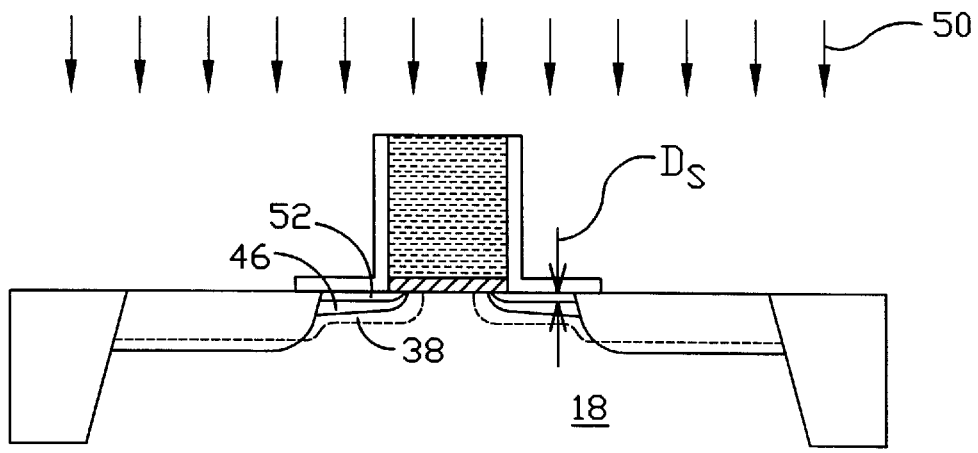
FIG. 7 is a side view of the device during SDE dopant implanting.

Now moving to block 48 and referring to FIG. 7, a source/drain extension (SDE) dopant, represented by arrows 50, is implanted into the substrate 18 partially under the gate stack 16 to establish an SDE extension region 52 that extends laterally under the gate stack 16 as shown. The SDE dopant can be established by Phosphorous, Arsenic, or Antimony for p-channel MOSFETs or Boron or Boron Fluoride ($BF_2$) for n-channel MOSFETs, and can be implanted at a peak concentration of, e.g., between $1\times10^{18}$ atoms/cc and $1\times10^{18}$ atoms/cc. Also, the SDE dopant is implanted down to an SDE depth of $D_S$ from the surface 40 of the substrate, with the preferred SDE depth $D_S$ being about one-half the halo depth $D_H$. Although FIG. 7 shows that the SDE dopant is directed normally down on the substrate 18 during implantation, it can alternatively be directed at an angle after the manner of the preamorphization and halo implanting described above.

Figure 8:
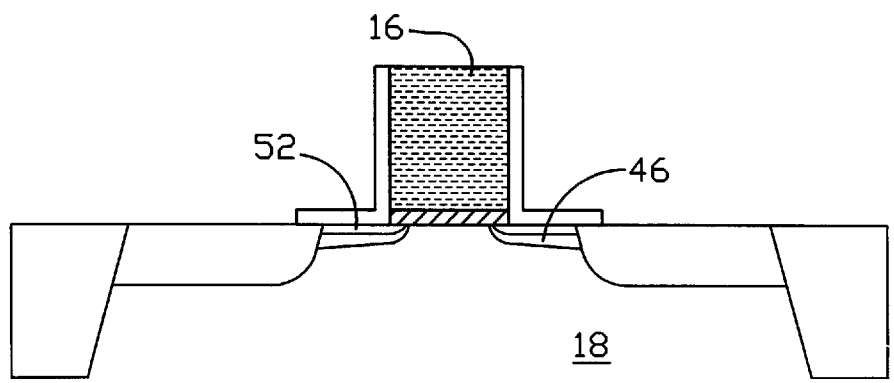
FIG. 8 is a side view of the device after SDE dopant and halo dopant activation.

In accordance with the present invention, thanks to the preamorphization substance implanting, at block 54 the SDE dopant and halo dopant are activated using low temperature annealing. In one embodiment, the annealing at block 54 is undertaken at a temperature of no more than nine hundred fifty degrees Celsius (950° C.), and more preferably at a temperature of no more than six hundred fifty degrees Celsius (650° C.), such that the SDE dopant is substantially not thermally diffused, as shown in FIG. 8. The annealing temperature preferably is maintained for a period sufficiently long to ensure that the preamorphization species fully recrystallizes. Processing, including the forming of contacts and interconnects, is completed at block 56.

While the particular METHOD FOR REDUCING LATERAL DOPANT GRADIENT IN SOURCE/DRAIN EXTENSION OF MOSFET as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A method for establishing at least one transistor on a semiconductor device, comprising:

providing a semiconductor substrate;

implanting source and drain dopants into the substrate to establish a source region and a drain region;

heating the substrate to activate the dopants; then implanting at least one neutral ion species in the substrate between the source and drain regions to define an amorphous extension region;

implanting at least a source/drain extension (SDE) dopant in the amorphous extension region; and heating at least the amorphous extension region to activate the SDE dopant.

2. The method of claim 1, wherein the substrate is heated to more than nine hundred fifty degrees Celsius (950° C.) to activate the source and drain dopants, and the amorphous extension region is heated to no more than nine hundred fifty degrees Celsius (950° C.).

3. The method of claim 2, wherein the amorphous extension region is heated to no more than six hundred fifty degrees Celsius (650° C.) such that the SDE dopant is substantially not thermally diffused after activation.

4. The method of claim 1, wherein the substrate defines a surface, and the neutral ion species is implanted in the substrate by directing a beam of the neutral ion species onto the surface at an oblique angle to the surface.

5. The method of claim 1, further comprising implanting a halo dopant in the amorphous extension region.

6. The method of claim 5, wherein the amorphous extension region defines a depth relative to a surface of the substrate, and the halo dopant is implanted to a halo depth of about one-half the depth of the amorphous extension region, the SDE dopant being implanted to a depth of about one-half the halo depth.

7. The method of claim 1, wherein the neutral ion species includes at least one of: Silicon (Si) and Germanium (Ge).

8. A method for making an ultra-large scale integration (ULSI) semiconductor device, comprising:

establishing source and drain regions in a semiconductor substrate using a first activation temperature; then establishing a doped source/drain extension (SDE) region between the source and drain regions using a second activation temperature less than the first activation temperature.

9. The method of claim 8, wherein the second activation temperature does not exceed nine hu ndred fifty degrees Celsius (950° C.).

10. The method of claim 9, wherein the second activation temperature does not exceed six hundred fifty degrees Celsius (650° C.).

11. The method of claim 8, further comprising:

after activating the source and drain regions, implanting at least one neutral ion species in the substrate between the source and drain regions to define an amorphous extension region;

implanting at least an SDE dopant in the amorphous extension region; then heating at least the amorphous extension region to the second activation temperature.

12. The method of claim 11, wherein the neutral ion species includes at least one of: Silicon (Si) and Germanium (Ge).

13. The method of claim 11, wherein the substrate defines a surface, and the neutral ion species is implanted in the substrate by directing a beam of the neutral ion species onto the surface at an oblique angle to the surface.

14. The method of claim 13, further comprising implanting a halo dopant in the amorphous extension region.

15. The method of claim 14, wherein the amorphous extension region defines a depth relative to a surface of the substrate, and the halo dopant is implanted to a halo depth of about one-half the depth of the amorphous extension region, the SDE dopant being implanted to a depth of about one-half the halo depth.

* * * * *